(12) United States Patent
Jeong et al.

(10) Patent No.: US 8,871,544 B2
(45) Date of Patent: Oct. 28, 2014

(54) VERTICAL LIGHT-EMITTING DEVICES HAVING PATTERNED EMITTING UNIT AND METHODS OF MANUFACTURING THE SAME

(71) Applicant: Samsung Electronics Co., Ltd., Suwon-Si (KR)

(72) Inventors: Hyung-su Jeong, Suwon-si (KR); Young-soo Park, Yongin-si (KR); Su-hee Chae, Suwon-si (KR); Bok-ki Min, Suwon-si (KR); Jun-youn Kim, Hwaseong-si (KR); Hyun-gi Hong, Suwon-si (KR); Young-jo Tak, Hwaseong-si (KR); Jae-won Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/067,185

(22) Filed: Oct. 30, 2013

(65) Prior Publication Data

US 2014/0057381 A1     Feb. 27, 2014

Related U.S. Application Data

(62) Division of application No. 12/926,854, filed on Dec. 14, 2010, now Pat. No. 8,592,839.

(30) Foreign Application Priority Data

May 6, 2010   (KR) ........................ 10-2010-0042589

(51) Int. Cl.
| | | |
|---|---|---|
| *H01L 21/00* | (2006.01) | |
| *H01L 33/00* | (2010.01) | |
| *H01L 33/32* | (2010.01) | |
| *H01L 27/15* | (2006.01) | |
| *H01L 33/38* | (2010.01) | |
| *H01L 33/42* | (2010.01) | |

(52) U.S. Cl.
CPC ............ *H01L 33/0025* (2013.01); *H01L 33/32* (2013.01); *H01L 33/38* (2013.01); *H01L 27/156* (2013.01); *H01L 33/42* (2013.01)
USPC ........................ 438/34; 438/46; 257/E33.012

(58) Field of Classification Search
USPC .................................................. 257/E33.012
See application file for complete search history.

(56) References Cited

U.S. PATENT DOCUMENTS

| | | | |
|---|---|---|---|
| 6,342,404 | B1 | 1/2002 | Shibata et al. |
| 7,569,461 | B2 | 8/2009 | Lee et al. |
| 2006/0286777 | A1 | 12/2006 | Lee et al. |
| 2007/0093037 | A1 | 4/2007 | Zhu et al. |

(Continued)

FOREIGN PATENT DOCUMENTS

| | | |
|---|---|---|
| JP | 11-233893 A | 8/1999 |
| JP | 2000-286450 A | 10/2000 |

(Continued)

*Primary Examiner* — Daniel Luke
(74) *Attorney, Agent, or Firm* — Harness, Dickey & Pierce, P.L.C.

(57) ABSTRACT

Example embodiments are directed to a light-emitting device including a patterned emitting unit and a method of manufacturing the light-emitting device. The light-emitting device includes a first electrode on a top of a semiconductor layer, and a second electrode on a bottom of the semiconductor layer, wherein the semiconductor layer is a pattern array formed of a plurality of stacks. A space between the plurality of stacks is filled with an insulating layer, and the first electrode is on the insulating layer.

4 Claims, 5 Drawing Sheets

(56) References Cited

U.S. PATENT DOCUMENTS

| | | |
|---|---|---|
| 2008/0210956 A1 | 9/2008 | Kim |
| 2008/0224154 A1 | 9/2008 | Jiang et al. |
| 2009/0224275 A1 | 9/2009 | Chan |
| 2009/0272994 A1 | 11/2009 | Lim |
| 2010/0051986 A1 | 3/2010 | Min et al. |
| 2010/0193813 A1 | 8/2010 | Kao et al. |
| 2011/0062480 A1 | 3/2011 | Lim |

FOREIGN PATENT DOCUMENTS

| | | |
|---|---|---|
| JP | 2007266589 A | 10/2007 |
| JP | 2008-277590 A | 11/2008 |
| KR | 100638869 B1 | 10/2006 |
| KR | 100675202 B1 | 1/2007 |
| KR | 100743470 B1 | 7/2007 |
| WO | WO-2009139603 A2 | 11/2009 |

US 8,871,544 B2

VERTICAL LIGHT-EMITTING DEVICES HAVING PATTERNED EMITTING UNIT AND METHODS OF MANUFACTURING THE SAME

CROSS-REFERENCE TO RELATED APPLICATIONS

This application is a divisional of U.S. application Ser. No. 12/926,854, filed on Dec. 14, 2010, which claims priority under 35 U.S.C. §119 to Korean Patent Application No. 10-2010-0042589, filed on May 6, 2010, in the Korean Intellectual Property Office, the disclosure of each of which is incorporated herein in their entirety by reference.

BACKGROUND

1. Field

Example embodiments relate to vertical light-emitting devices wherein an emitting unit is patterned to form a pattern array.

2. Description of the Related Art

Nitride semiconductor-based light-emitting devices are classified into horizontal light-emitting devices and vertical light-emitting devices. Unlike the horizontal light-emitting devices, wherein a part of a semiconductor layer is etched and an electrode is formed on the etched part of the semiconductor layer, the vertical light-emitting devices include electrodes that are directly disposed on top and bottom surfaces of a semiconductor structure, and thus a current may be efficiently applied from the electrodes to the semiconductor structure. Accordingly, the vertical light-emitting devices have improved efficiency and an improved output, compared to the horizontal light-emitting devices.

The nitride semiconductor-based light-emitting devices include an epitaxial nitride semiconductor layer grown on a sapphire substrate by using, for example, a metal-organic chemical vapor deposition (MOCVD) method. However, the sapphire substrate is relatively expensive, and it is difficult to use a large size sapphire substrate in a vertical device due to an insulating property of the sapphire substrate.

A silicon substrate, which is widely used in the semiconductor industry, is inexpensive and a large dimension substrate may be obtained with relative ease. Thus, methods of growing a nitride semiconductor by using the silicon substrate are being conducted in fields of fabricating a nitride semiconductor.

An epitaxial growth according to the MOCVD method is performed at a high temperature of about 1000° C. or above, and differences of lattice constants and thermal expansion coefficients between a substrate and a nitride semiconductor are considered when selecting the substrate. The difference of the lattice constants may increase dislocation density, and the difference of the thermal expansion coefficients may cause substrate bending while cooling the substrate to room temperature. Since silicon has a larger thermal expansion coefficient than gallium nitride (GaN), a tensile stress may be applied to a GaN layer, thereby cracking a nitride semiconductor. Such cracks may worsen as the size of the substrate is increased. Accordingly, it is important to reduce the generation of the cracks while growing the nitride semiconductor using the silicon substrate.

SUMMARY

According to example embodiments, a vertical light-emitting device includes a semiconductor layer including an active layer configured to emit light; a first electrode on a top of the semiconductor layer; and a second electrode on a bottom of the semiconductor layer, wherein the semiconductor layer is a pattern array formed of a plurality of stacks, and a space between the plurality of stacks is filled with an insulating layer.

According to example embodiments, the light-emitting device further includes a silicon substrate on a bottom of the second electrode.

According to example embodiments, a bonding metal layer is between the second electrode and the silicon substrate.

According to example embodiments, the first electrode is a grid electrode on the insulating layer.

According to example embodiments, the light-emitting device further includes a transparent electrode covering the semiconductor layer and the insulating layer, the transparent electrode being between the first electrode and the insulating layer.

According to example embodiments, a width of the first electrode is smaller than or equal to a width of the insulating layer.

According to example embodiments, a width of the first electrode is larger than a width of the insulating layer such that the first electrode on the insulating layer contacts the semiconductor layer.

According to example embodiments, the light-emitting device further includes a conductive buffer layer on the bottom of the semiconductor layer, wherein the second electrode is a conductive silicon substrate contacting the conductive buffer layer and having the insulating layer thereon.

According to example embodiments, the silicon substrate has a plurality of protrusions corresponding to the plurality of the stacks, and the conductive buffer layer and the semiconductor layer are sequentially stacked on the plurality of protrusions.

According to example embodiments, the first electrode is a grid electrode on the insulating layer.

According to example embodiments, a width of the first electrode is larger than a width of the insulating layer such that the first electrode on the insulating layer contacts the semiconductor layer.

According to example embodiments, the light-emitting device further includes a transparent electrode between the first electrode and the insulating layer, the transparent electrode covering the semiconductor layer and the insulating layer.

According to example embodiments, a width of the first electrode is smaller than or equal to a width of the insulating layer.

According to example embodiments, a method of manufacturing a light-emitting device includes stacking a buffer layer and a semiconductor layer on a plurality of protrusions formed in an array pattern, wherein the plurality of protrusions are formed on a first substrate; filling a trench between the plurality of protrusions with an insulating layer up to a height of the semiconductor layer; stacking a first electrode layer to cover the semiconductor layer and the insulating layer on the semiconductor layer, and a bonding metal layer; bonding a second substrate on the bonding metal layer; removing the first substrate and the buffer layer; and forming a second electrode on the insulating layer to contact the semiconductor layer.

According to example embodiments, the method further includes forming a transparent electrode layer between the semiconductor layer and the second electrode.

According to example embodiments, stacking of the buffer layer and the semiconductor layer includes forming the plurality of protrusions in the pattern array by patterning the first substrate; and sequentially stacking the buffer layer and the semiconductor layer on the plurality of protrusions.

According to example embodiments, stacking of the buffer layer and the semiconductor layer includes sequentially stacking the buffer layer and the semiconductor layer on the first substrate; and sequentially patterning the semiconductor layer, the buffer layer, and a surface of the first substrate.

According to example embodiments, a method of manufacturing a light-emitting device including stacking a conductive buffer layer and a semiconductor layer on a plurality of protrusions in an array pattern, wherein the plurality of protrusions are formed on a first conductive substrate; filling a trench between the plurality of protrusions with an insulating layer up to a height of the semiconductor layer; and forming a first electrode on the insulating layer to contact the semiconductor layer.

According to example embodiments, the method further includes forming a transparent electrode layer between the semiconductor layer and the first electrode.

According to example embodiments, stacking of the conductive buffer layer and the semiconductor layer includes forming the plurality of protrusions in an array pattern by patterning the first conductive substrate; and sequentially stacking the conductive buffer layer and the semiconductor layer on the plurality of protrusions.

According to example embodiments, stacking of the conductive buffer layer and the semiconductor layer includes sequentially stacking the conductive buffer layer and the semiconductor layer on the first conductive substrate; and sequentially patterning the semiconductor layer, the conductive buffer layer, and a surface of the first conductive substrate.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
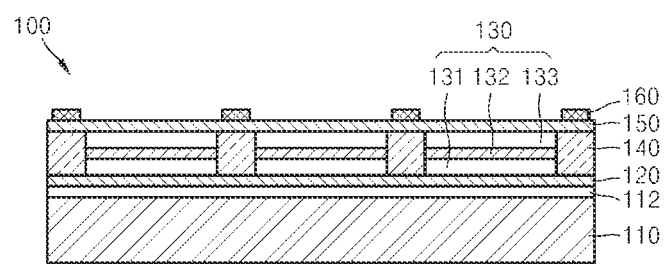
FIG. 1 a cross-sectional view illustrating a vertical light-emitting device including a patterned emitting unit, according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
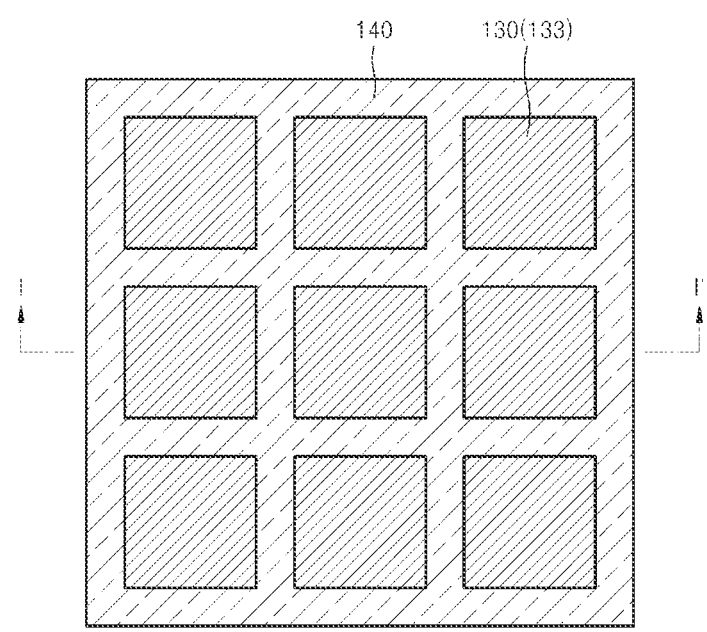
FIG. 2 is a plan view of the vertical light-emitting device of FIG. 1.

FIG. 1 a cross-sectional view illustrating a vertical light-emitting device 100 including a patterned emitting unit, according to example embodiments, and FIG. 2 is a plan view of the vertical light-emitting device 100 of FIG. 1. Some elements are not illustrated in FIG. 2 for convenience, and FIG. 1 is a cross-sectional view taken along a line I-I' of FIG. 2.

Referring to FIGS. 1 and 2, a first electrode layer 120 is formed on a substrate 110. A bonding metal layer 112 may be formed between the substrate 110 and the first electrode layer 120. A method of manufacturing the bonding metal layer 112 will be described later in detail. A patterned group III nitride semiconductor layer 130 is formed on the first electrode layer 120. The semiconductor layer 130 is a stack including a plurality of layers. In FIG. 2, the semiconductor layer 130 is disposed on one light-emitting device in a 3×3 array, but the semiconductor layer 130 is not limited thereto.

The semiconductor layer 130 includes a first semiconductor layer 131, an active layer 132, and a second semiconductor layer 133, which are sequentially stacked on the first electrode layer 120. The semiconductor layers 130 are separated by an insulating layer 140. A transparent electrode 150 having a flat panel shape is disposed on the semiconductor layer 130 and the insulating layer 140. A second electrode 160 is formed on the transparent electrode 150, corresponding to the insulating layer 140. The second electrode 160 may be referred to as a grid electrode.

The insulating layer 140 may be formed of polyimide, cyclobutene, silicon oxide, spin-on glass (SOG) a combination thereof, or the like.

The first semiconductor layer 131, the active layer 132, and the second semiconductor layer 133 may each include a group III nitride semiconductor, and in detail, may each include a compound including nitrogen (N) and at least one of gallium (Ga), indium (In), and/or aluminum (Al). Specifically, a band gap of the active layer 132 is smaller than band gaps of the first and second semiconductor layers 131 and 133, and the active layer 132 includes indium (In), for example.

When the first electrode layer 120 is a p-type electrode, the first semiconductor layer 131 is a p-type semiconductor layer and for example, may be formed by doping a GaN layer with a p-type impurity, such as magnesium (Mg).

The second electrode 160 may be an n-type electrode, and the second semiconductor layer 133 may be formed by doping a GaN layer with an n-type impurity, such as silicon (Si). The active layer 132 is an active area for generating light by recombining holes and electrons, and may have a single or multiple quantum well structure. The active layer 132 may be an AlGaInN layer, for example.

The bonding metal layer 112 is a layer for wafer-bonding the substrate 110 formed of, for example, silicon, with another substrate. The bonding metal layer 112 may be formed of gold (Au) or a eutectic bonding material, such as an AuSn alloy or an AuGe alloy, having electrical conductivity. By melting the bonding metal layer 112, the substrate 110 may be bonded to a semiconductor layer. The bonding metal layer 112 may have a thickness of about 0.5 μm or greater. The AuSn alloy has a melting point of about 280° C. and the AuGe alloy has a melting point of about 300° C. or above.

The semiconductor layer 130 may be an epitaxially grown layer.

The transparent electrode 150 may be formed of indium tin oxide (ITO), or the like. The transparent electrode 150 spreads a current flowing between the first electrode layer 120 and the second electrode 160. A width of the second electrode 160 on the insulating layer 140 is smaller than a width of the insulating layer 140, and thus the second electrode 160 does not interfere with light transmitted from the active layer 132, thereby improving light emitting efficiency.

Specifically, the vertical light-emitting device 100 according to example embodiments includes the semiconductor layer 130 formed in a patterned array, thus the generation of a crack is suppressed during a cooling process after an epitaxial growth, and high light emitting efficiency may be obtained.

Figure 3:
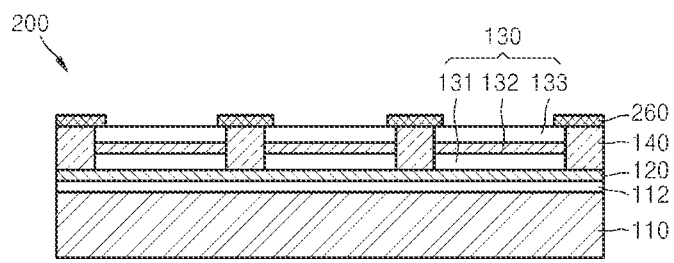
FIG. 3 is a cross-sectional view illustrating a vertical light-emitting device including a patterned emitting unit, according to example embodiments.

FIG. 3 is a cross-sectional view schematically illustrating a vertical light-emitting device 200 including a patterned emitting unit, according to example embodiments. In FIGS. 1 and 3, like reference numerals refer to like elements and detailed descriptions thereof will not be repeated.

Referring to FIG. 3, the transparent electrode 150 of FIG. 1 is not formed on a semiconductor layer 130. A second electrode 260 is formed on an insulating layer 140 to correspond to the insulating layer 140, and contacts a second semiconductor layer 133 of the semiconductor layer 130.

Figure 4:
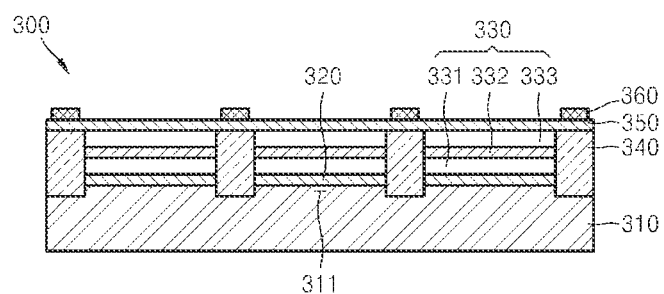
FIG. 4 is a cross-sectional view schematically illustrating a vertical light-emitting device including a patterned emitting unit, according to example embodiments.

FIG. 4 is a cross-sectional view schematically illustrating a vertical light-emitting device 300 including a patterned emitting unit, according to example embodiments.

Referring to FIG. 4, a substrate 310 has a patterned structure with a protrusion 311. A conductive buffer layer 320 is formed on the protrusion 311 of the substrate 310. The conductive buffer layer 320 may be formed of zirconium nitride (ZrN), zirconium boride ($ZrB_2$), a combination thereof, or the like.

A group III nitride semiconductor layer 330 is formed on the conductive buffer layer 320 in an array. The semiconductor layer 330 may have a patterned array as the semiconductor 130 shown in FIG. 2. A groove or a trench between the semiconductor layer 330 may be filled with an insulating layer 340.

The semiconductor layer 330 includes a first semiconductor layer 331, an active layer 332, and a second semiconductor layer 333, which are sequentially stacked on the conductive buffer layer 320. A transparent electrode 350 having a flat panel shape is disposed on the semiconductor layer 330. A second electrode 360 is formed on the transparent electrode 350 to correspond to the insulating layer 340. The second electrode 360 is referred to as a grid electrode.

The insulating layer 340 may be formed of polyimide, cyclobutene, silicon oxide, SOG, a combination thereof, or the like.

The first semiconductor layer 331, the active layer 332, and the second semiconductor layer 333 may each include a group III nitride semiconductor, and in detail, may each include a compound including N and at least one of Ga, In, and/or Al. Specifically, a band gap of the active layer 332 is smaller than the band gaps of the first and second semiconductor layers 331 and 333, and the active layer 332 includes In, for example.

The substrate 310 is a conductive substrate. For example, the substrate 310 may be a silicon substrate including impurities. The substrate 310 operates as an electrode for injecting a current into the semiconductor layer 330. The second electrode 360 may be an n-type electrode, and the second semiconductor layer 333 may be formed by doping a GaN layer with an n-type impurity, such as Si. The active layer 332 is an active area for generating light by recombining holes and electrons, and may have a single or multiple quantum well structure. The active layer 332 may be an AlGaInN layer, for example.

The semiconductor layer 330 may be an epitaxially grown layer.

The transparent electrode 350 may be formed of ITO, or the like. The transparent electrode 350 spreads a current flowing between the substrate 310 and the second electrode 360. When the second electrode 360 overlaps with the insulating layer 340, the second electrode 360 does not interfere with light from the active layer 332, and thus light emitting efficiency may be improved.

Figure 5:
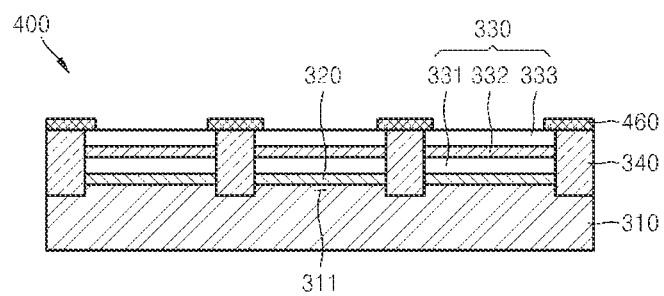
FIG. 5 is a cross-sectional view schematically illustrating a vertical light-emitting device including a patterned emitting unit, according to example embodiments.

FIG. 5 is a cross-sectional view schematically illustrating a vertical light-emitting device 400 including a patterned emitting unit, according to example embodiments. In FIGS. 4 and 5, like reference numerals refer to like elements and detailed descriptions thereof will not be repeated.

Referring to FIG. 5, the transparent electrode 350 of FIG. 4 is not formed on the semiconductor layer 330. A second electrode 460 is formed on the insulating layer 340 to correspond to the insulating layer 340, and is formed to contact a second semiconductor layer 333 of the semiconductor layer 330.

FIGS. 6A through 6F are cross-sectional views for describing a method of manufacturing the vertical light-emitting device 100 of FIG. 1, which includes a patterned nitride semiconductor layer in an array, according to example embodiments.

Figure 6A:
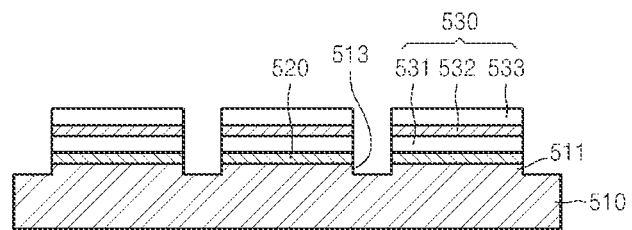
FIGS. 6A through 6F are cross-sectional views for describing a method of manufacturing the vertical light-emitting device of FIG. 1, which includes a patterned nitride semiconductor layer in an array, according to example embodiments.

Referring to FIG. 6A, a first substrate 510 is patterned to form a plurality of patterned protrusions 511. A concavity 513 between the protrusions 511 is a trench. The first substrate 510 may be a silicon substrate. The protrusions 511 may be formed in an array as the semiconductor 130 shown in FIG. 2.

A buffer layer 520 is deposited on each of the protrusions 511. The buffer layer 520 may be formed of AlN.

Next, a semiconductor layer 530 formed of a group III nitride is epitaxially grown on the buffer layer 520. The semiconductor layer 530 is formed by sequentially stacking a first semiconductor layer 531, an active layer 532, and a second semiconductor layer 533 on the buffer layer 520. The first semiconductor layer 531 may be an n-type semiconductor layer, and may be formed by doping a GaN layer with an n-type impurity. The active layer 532 is an active area for generating light by recombining electrons and holes, and may be a single or multiple quantum well structure. The active layer 532 may be an AlGaInN layer. The second semiconductor layer 533 may be formed by doping a GaN layer with a p-type impurity.

In FIG. 6A, the first substrate 510 is etched to form a patterned semiconductor layer array, but example embodiments are not limited thereto. For example, the buffer layer 520, the first semiconductor layer 531, the active layer 532, and the second semiconductor layer 533 may be sequentially formed on the first substrate 510, and then may be etched to form the structure of FIG. 6A.

Figure 6B:
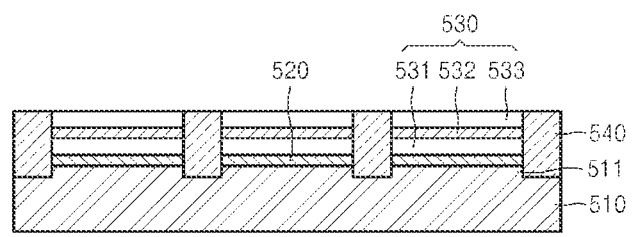

Referring to FIG. 6B, an insulating layer 540 fills the concavity 513 between the semiconductor layer 530 up to a height of the semiconductor layer 530. Accordingly, a flat surface may be obtained, and a parasitic resistance may be reduced by passivating a side of the semiconductor layer 530. The concavity 513 may be filled with an organic or inorganic material. For example, the concavity 513 may be filled with a cyclobutene-based polymer, polyimide, a silicon oxide, and/or SOG. A plan view of FIG. 6B may be somewhat similar to that of FIG. 2.

Figure 6C:
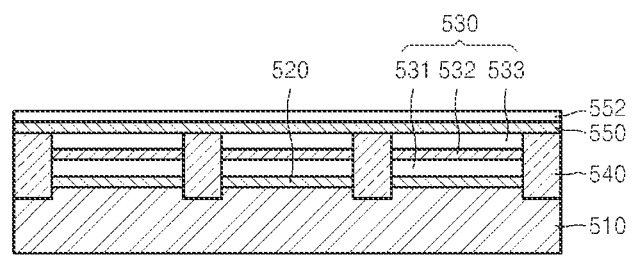

Referring to FIG. 6C, a first electrode layer 550 is formed on the semiconductor layer 530, and a bonding metal layer 552 for wafer-bonding is formed on the first electrode layer 550. The first electrode layer 550 is formed on the second semiconductor layer 533, which is a p-type semiconductor layer.

While forming the first electrode layer 550, a current blocking layer (CBL) (not shown) may be inserted between the semiconductor layer 530 and the first electrode layer 550 so as to improve a current flow. Each of the first electrode layer 550 and the bonding metal layer 552 may be formed of a plurality of layers. Also, the bonding metal layer 552 and the first electrode layer 550 may operate as light reflecting layers so that light emitted from the active layer 532 is not absorbed by a silicon layer (a second substrate 560 of FIG. 6D) to be described later. The bonding metal layer 552 may be formed of Au or a eutectic bonding material such as an AuSn alloy or an AuGe alloy, which has electrical conductivity. The bonding metal layer 552 may have a thickness of about 0.5 µm or greater. The AuSn alloy has a melting point of about 280° C., and the AuGe alloy has a melting point of about 300° C. or above.

Figure 6D:
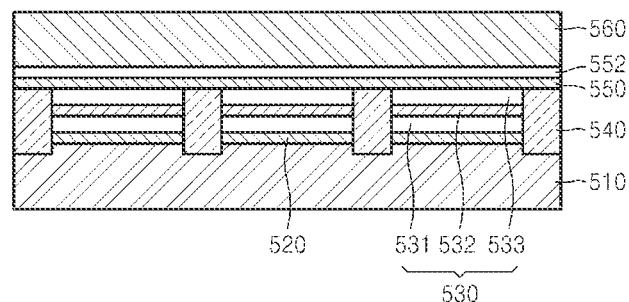

Referring to FIG. 6D, the second substrate 560, which is a conductive substrate, is bonded on the bonding metal layer 552. The second substrate 560 may be a silicon substrate. When the bonding metal layer 560 is formed of Au, the bonding metal layer 552 and the second substrate 560 may be bonded to each other at a low temperature as an Au—Si layer is formed on a surface where the bonding metal layer 552 and the second substrate 560 contact each other.

Figure 6E:
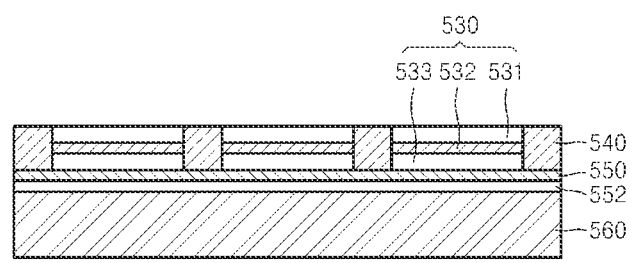

Referring to FIG. 6E, the first substrate 510 and the buffer layer 520 are sequentially removed, and an exposed surface may be planarized using chemical-mechanical polishing method, for example.

Figure 6F:
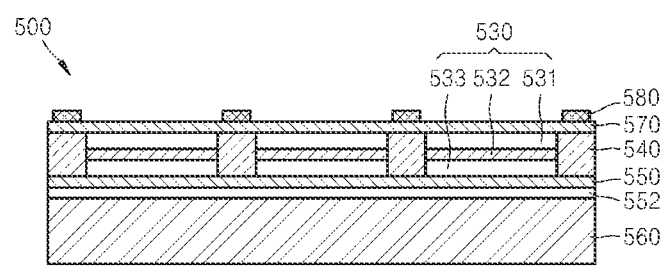

Referring to FIG. 6F, a transparent electrode layer 570 is deposited on the semiconductor layer 530 so as to spread a current on the semiconductor layer 530. The transparent electrode layer 570 may be formed of ITO, for example.

A second electrode 580 is formed on the transparent electrode layer 570. Since the second electrode 580 is formed on the first semiconductor layer 531 constituting an n-type semiconductor layer, the second electrode 580 is formed of an n-type electrode material. The second electrode 580 is formed corresponding to the insulating layer 540 so that light from the active layer 532 is not interfered while being externally emitted, and a width of the second electrode 580 is less than a width of the insulating layer 540. The second electrode 580 may be a grid electrode having the same shape as the insulating layer 140 of FIG. 2.

In FIG. 6F, the second electrode 580 may be directly formed on the insulating layer 540 without the transparent electrode layer 570. In this case, the second electrode 580 contacts the semiconductor layer 530 as shown in FIG. 3.

FIG. 6F shows only one light-emitting device for convenience of description. However, a plurality of the light-emitting devices may be formed as a wafer bonding scale, and the plurality of the light-emitting devices are diced to obtain an individual device as shown in FIG. 6F.

In the method according to example embodiments, a plurality of semiconductor layer stacks are arranged in an array, and thus a generation of cracks in the semiconductor layer may be reduced. Also, a space between the semiconductor layer stacks are filled with and protected by the insulating layer, and the second electrode is formed on the insulating layer to correspond the insulating layer, thereby improving light emitting efficiency.

Figure 7A:
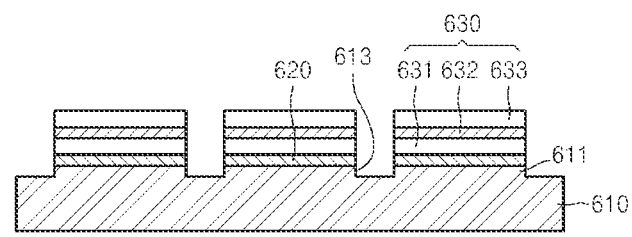
FIGS. 7A through 7C are cross-sectional views for describing a method of manufacturing the vertical light-emitting device of FIG. 4, which includes a patterned nitride semiconductor layer in an array, according to example embodiments.
Figure 7B:
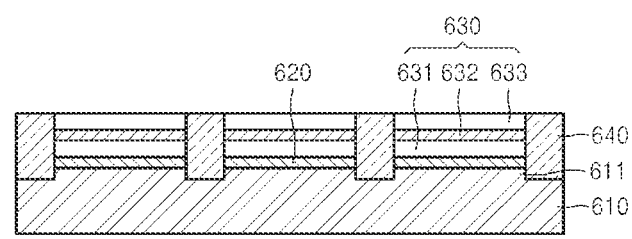
Figure 7C:
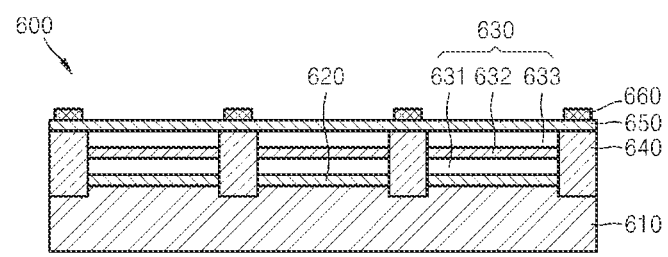

FIGS. 7A through 7C are cross-sectional views for describing a method of manufacturing the vertical light-emitting device 300 of FIG. 4, which include a patterned nitride semiconductor layer in an array, according to example embodiments.

Referring to FIG. 7A, a plurality of protrusions 611 are formed by patterning a first substrate 610, which is a conductive substrate. A concavity 613 between the protrusions 611 is a trench. The first substrate 610 may be a silicon substrate having impurities therein.

A buffer layer 620 is deposited on each of the protrusions 611. The buffer layer 620 may be formed of ZrN and/or $ZrB_2$, which is a conductive material.

Next, a semiconductor layer 630 formed of a group III nitride is epitaxially grown on the buffer layer 620. The semiconductor layer 630 is formed by sequentially stacking a first semiconductor layer 631, an active layer 632, a second semiconductor layer 633 on the buffer layer 620. The first semiconductor layer 631 is an n-type semiconductor layer, and may be formed by doping a GaN layer with an n-type impurity. The active layer 632 is an active area for generating light by recombining electrons and holes, and may have a single or multiple quantum well structure. The active layer 632 may be an AlGaInN layer. The second semiconductor layer 633 may be formed by doping a GaN layer with a p-type impurity.

In FIG. 7A, the first substrate 610 is etched first to form a patterned semiconductor layer array, but example embodiments are not limited thereto. For example, the buffer layer 620, the first semiconductor layer 631, the active layer 632, and the second semiconductor layer 633 are sequentially formed on the first substrate 610, and then are etched to form the structure of FIG. 7A.

Referring to FIG. 7B, the concavity 613 between the semiconductor layers 630 is filled with an insulating layer 640 up to a height of the semiconductor layer 630. Accordingly, a flat surface may be obtained, and electrical characteristics are improved by protecting a side of the semiconductor layer 630. The concavity 613 may be filled with the insulating layer 640 at the next stage, which will be described later. The insulating layer 640 may be formed of an organic or inorganic material. A plan view of FIG. 7B may be like that of FIG. 2.

Referring to FIG. 7C, a transparent electrode layer 650 for spreading a current on the semiconductor layer 630 is deposited on the semiconductor layer 630. The transparent electrode layer 650 may be formed by using ITO, for example.

A first electrode 660 is formed on the transparent electrode layer 650. Since the first electrode 660 is formed on the first semiconductor layer 631 constituting a p-type semiconductor layer, the first electrode 660 is formed of a p-type electrode material, such as Cu, Ni, Au, a combination thereof, or the like.

The first electrode 660 is formed corresponding to the insulating layer 640 so that light from the active layer 632 is not interrupted from being externally emitted, and a width of the first electrode 660 is smaller than a width of the insulating layer 640. The first electrode 660 may be a grid electrode having the same shape as the insulating layer 140 of FIG. 2.

In FIG. 7C, the first electrode 660 may be formed directly on the insulating layer 640 without the transparent electrode layer 650. In this case, the first electrode 660 is formed to contact the semiconductor layer 630 as shown in FIG. 3.

As described above, according to example embodiments, production costs of a vertical light-emitting device including a patterned emitting unit are reduced since the vertical light-emitting device includes a low-priced silicon substrate, and a light emitting efficiency of the vertical light-emitting device is improved since generation of cracks in a semiconductor layer arranged in a patterned array is reduced. Also, since an electrode is formed on an area where the semiconductor layer is removed through patterning, light lost by the electrode may be reduced.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of manufacturing a light-emitting device, the method comprising:
    stacking a buffer layer and a semiconductor layer on a plurality of protrusions formed in an array pattern, wherein the plurality of protrusions are formed on a first substrate;
    filling a trench between the plurality of protrusions with an insulating layer up to a height of the semiconductor layer;
    stacking a first electrode layer to cover the semiconductor layer and the insulating layer on the semiconductor layer, and a bonding metal layer;
    bonding a second substrate on the bonding metal layer;
    removing the first substrate and the buffer layer;
    forming a transparent electrode layer on the semiconductor layer; and
    forming a second electrode on the transparent electrode layer, wherein,
        the forming a transparent electrode layer forms the transparent electrode layer to cover the semiconductor layer and the insulating layer such that a contiguous portion of the transparent electrode extends over multiple protrusions in the plurality of protrusions and the trench between the multiple protrusions,
        the filling includes forming the insulating layer to have a grid pattern, and
        the forming a second electrode forms the second electrode to have the grid pattern and be substantially aligned with the insulating layer.

2. The method of claim 1, wherein stacking of the buffer layer and the semiconductor layer comprises:
    forming the plurality of protrusions in the pattern array by patterning the first substrate; and
    sequentially stacking the buffer layer and the semiconductor layer on the plurality of protrusions.

3. The method of claim 1, wherein stacking of the buffer layer and the semiconductor layer comprises:
    sequentially stacking the buffer layer and the semiconductor layer on the first substrate; and
    sequentially patterning the semiconductor layer, the buffer layer, and a surface of the first substrate.

4. The method of claim 1, wherein a width of the second electrode is less than or equal to a width of the trench.

* * * * *